United States Patent
Yamada

(10) Patent No.: US 8,536,710 B2
(45) Date of Patent: Sep. 17, 2013

(54) SEMICONDUCTOR DEVICE AND MANUFACTURING METHOD THEREOF

(75) Inventor: Noriteru Yamada, Oita-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 73 days.

(21) Appl. No.: 13/048,176

(22) Filed: Mar. 15, 2011

(65) Prior Publication Data

US 2011/0304030 A1 Dec. 15, 2011

(30) Foreign Application Priority Data

Jun. 9, 2010 (JP) ................................ 2010-132160

(51) Int. Cl.
*H01L 23/48* (2006.01)
*H01L 23/52* (2006.01)

(52) U.S. Cl.
USPC .... 257/774; 257/784; 257/635; 257/E23.002; 257/737; 257/E23.024

(58) Field of Classification Search
USPC ............ 257/784, 786, 781, 758, 774, E31.11, 257/E21.11, 759, E23.145, 618, 620, 621, 257/635, 734, 737, 765, E23.001, E23.002, 257/E23.011, E23.02, E23.024, E23.168, 257/E23.18
See application file for complete search history.

(56) References Cited

U.S. PATENT DOCUMENTS

| | | | | |
|---|---|---|---|---|
| 4,561,015 A | * | 12/1985 | Korch | 348/340 |
| 5,543,586 A | * | 8/1996 | Crane et al. | 174/262 |
| 6,163,075 A | * | 12/2000 | Okushima | 257/759 |
| 6,297,563 B1 | * | 10/2001 | Yamaha | 257/781 |
| 6,420,254 B1 | * | 7/2002 | Stamper et al. | 438/612 |
| 6,710,448 B2 | * | 3/2004 | Wang | 257/758 |
| 7,067,902 B2 | * | 6/2006 | Hichri et al. | 257/621 |
| 7,273,804 B2 | * | 9/2007 | Angell et al. | 438/612 |
| 7,372,168 B2 | * | 5/2008 | Wu et al. | 257/784 |
| 7,550,376 B2 | * | 6/2009 | Watanabe | 438/622 |
| 7,883,917 B2 | * | 2/2011 | Liu et al. | 438/48 |
| 8,044,482 B2 | * | 10/2011 | Ota et al. | 257/459 |
| 2009/0185060 A1 | * | 7/2009 | Akiyama | 348/294 |

FOREIGN PATENT DOCUMENTS

| | | | |
|---|---|---|---|
| JP | 2000-012604 | * | 1/2000 |
| JP | 2000012604 | | 1/2000 |
| JP | 2001267323 | | 9/2001 |

* cited by examiner

*Primary Examiner* — Cuong Q Nguyen
*Assistant Examiner* — Galina Yushina
(74) *Attorney, Agent, or Firm* — White & Case LLP

(57) ABSTRACT

A semiconductor device includes: an insulating layer formed on a substrate; a plurality of interlayer insulating films which are formed on the insulating layer and comprise an opening window; a multilayer wiring which is formed with a plurality of wiring layers and a plurality of vias formed in the plurality of interlayer insulating films; a metal pad connected with the multilayer wiring, an upper surface part of the metal pad being a bottom part of the opening window, the metal pad formed closer to the substrate than a wiring layer of a lower-most layer of the plurality of wiring layers and is; and a pad ring provided on the metal pad, the pad ring penetrating the plurality of interlayer insulating films and the pad ring surrounding the opening window.

7 Claims, 4 Drawing Sheets

SEMICONDUCTOR DEVICE AND MANUFACTURING METHOD THEREOF

CROSS-REFERENCE TO RELATED APPLICATION

This application is based upon and claims the benefit of priority from the prior Japanese Patent Application No. 2010-132160 filed on Jun. 9, 2010, the entire contents of which are incorporated herein by reference.

BACKGROUND

Embodiments described herein related generally to a semiconductor device and a manufacturing method thereof.

Generally, a semiconductor device adopts a multilayer wiring structure in which wirings and vias are provided in an interlayer insulating film. A bonding metal pad is formed on the upper surface side of the uppermost wiring layer of the multilayer wiring structure, and wire is bonded in an opening window formed in a passivation film of the upper layer.

Recently, in order to solve problems such as signal delay and an increase in power consumption due to an increase in the amount of an inter-wiring capacitance following miniaturization of semiconductor devices, a low-permittivity film (hereinafter "low-k film") having the relative permittivity equal to or less than 2.5 is used as an interlayer insulating film. Various studies have been made to use an organic polymer material or a porous material as this low-k film to further decrease the permittivity.

However, such a low-k film has a low mechanical strength, and therefore deformation or cracking occurs due to the load upon wire bonding. Therefore, the low-k film absorbs moisture, and there is a problem in that barrier metal film of wirings, vias and the like is oxidized and the reliability of semiconductor devices decreases. Hence, various methods are adopted of preventing deformation or cracking of the low-k film by reinforcing the lower layer of a metal pad.

DETAILED DESCRIPTION

Figure 1:
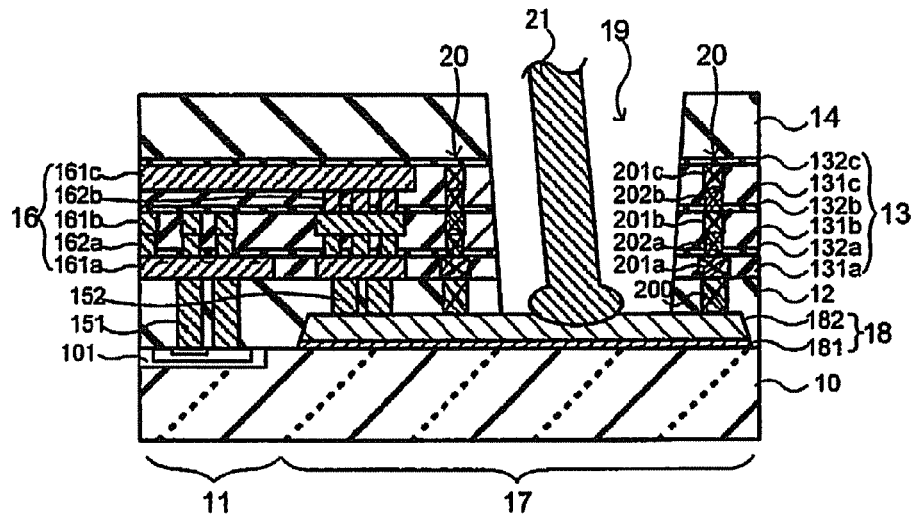
FIG. 1 is a view illustrating a semiconductor device according to an embodiment.

Reference will now be made in detail to the present embodiment of the invention, an example of which is illustrated in the accompanying drawings. Wherever possible, the same reference numbers will be used throughout the drawing to refer to the same or like parts.

First Embodiment

FIG. 1 is a sectional view of a semiconductor device according to the present embodiment. As illustrated in FIG. 1, an insulating layer 12 made of, for example, TEOS (Tetra Ethoxy Silane) is formed on a substrate 10 having on its surface an element area 11 on which an active element 101 such as a transistor is formed. The substrate 10 is made of, for example, Si or SOI (Silicon On Insulator). On the insulating layer 12, an interlayer insulating film 13 is formed. The interlayer insulating film 13 is composed of alternate low-k films 131a, 131b and 131c, and cap films 132a, 132b and 132c. Each of the low-k films 131a, 131b and 131c has the relative permittivity equal to or less than 2.5, and is made of SiOC and the like, and each of the cap films 132a, 132b and 132c is made of SiO and the like. A passivation film 14 is formed on the interlayer insulating film 13.

Note that, although in the present embodiment, the interlayer insulating film 13 is formed by layering three layers of low-k films and cap films, the number of layers is not limited to this, and, for example, ten or more layers may be formed as necessary. The same applies to wiring layers or vias which will be described below.

A substrate contact 151 is formed in the insulating layer 12 on the element area 11. The multi-layer wiring 16 is formed on the upper surface of the insulating layer 12. The multilayer wiring 16 is formed with wiring layers 161a, 161b and 161c including Cu and the like, and vias 162a and 162b connecting between the wiring layers 161a and 161b and between the wiring layers 161b and 161c.

On a non-element area 17 which is an area other than the element area 11, a metal pad 18 is formed on the lower surface closer to the semiconductor substrate 10 side than the wiring layer 161a of the lowermost layer. The metal pad 18 is composed of a barrier metal layer 181 of a lower layer and an Al layer 182 and the like of an upper layer. On the metal pad 18, the pad contact 152 is provided, and is connected with the multilayer wiring 16 on the element area 11 through the wiring layers 161a, 161b and 161c and vias 162a and 162b. The upper surface of the metal pad 18 is closer to the substrate 10 than the upper surface of the insulating layer 12, and the opening window 19 reaching the metal pad 18 is provided to penetrate the passivation film 14 and interlayer insulating film 13.

A pad ring 20 is provided to penetrate the interlayer insulating film 13 on the metal pad 18 and surround the opening window 19. The pad ring 20 is formed with layered bodies including ring shaped metal layers 200, 201a, 201b, 201c, 202a and 202b made of the same material in the same layers as the pad contacts 152, wiring layers 161a, 161b and 161c, and vias 162a and 162b, respectively. That is, the metal pad is formed closer to the substrate 10 than the wiring layer 161a of the lowermost layer.

In the metal pad 18, a wire 21 is bonded which is connected with, for example, a lead frame (not shown) through the opening window 19.

Figure 2:
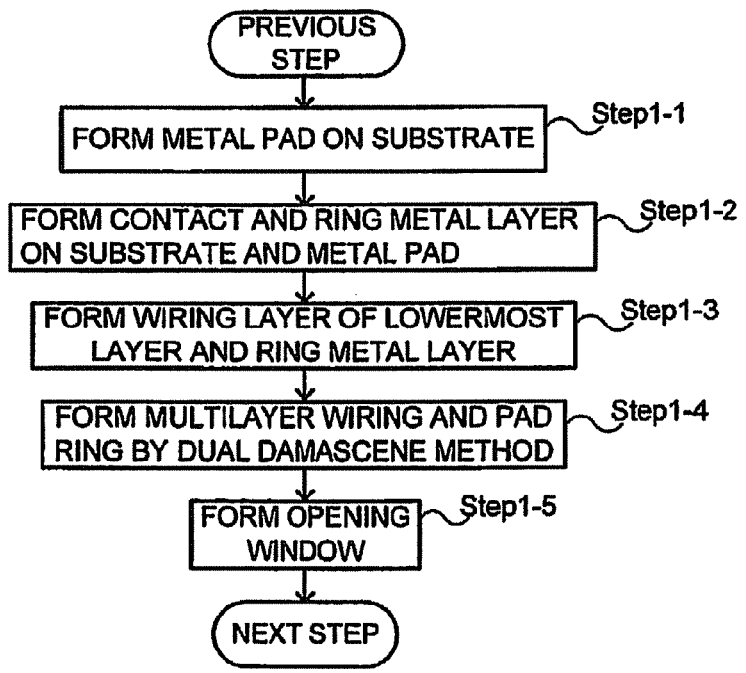
FIG. 2 is a flowchart illustrating semiconductor device manufacturing steps according to an embodiment.

This semiconductor device is formed according to, for example, the manufacturing steps illustrated in the flowchart of FIG. 2.

Figure 3:
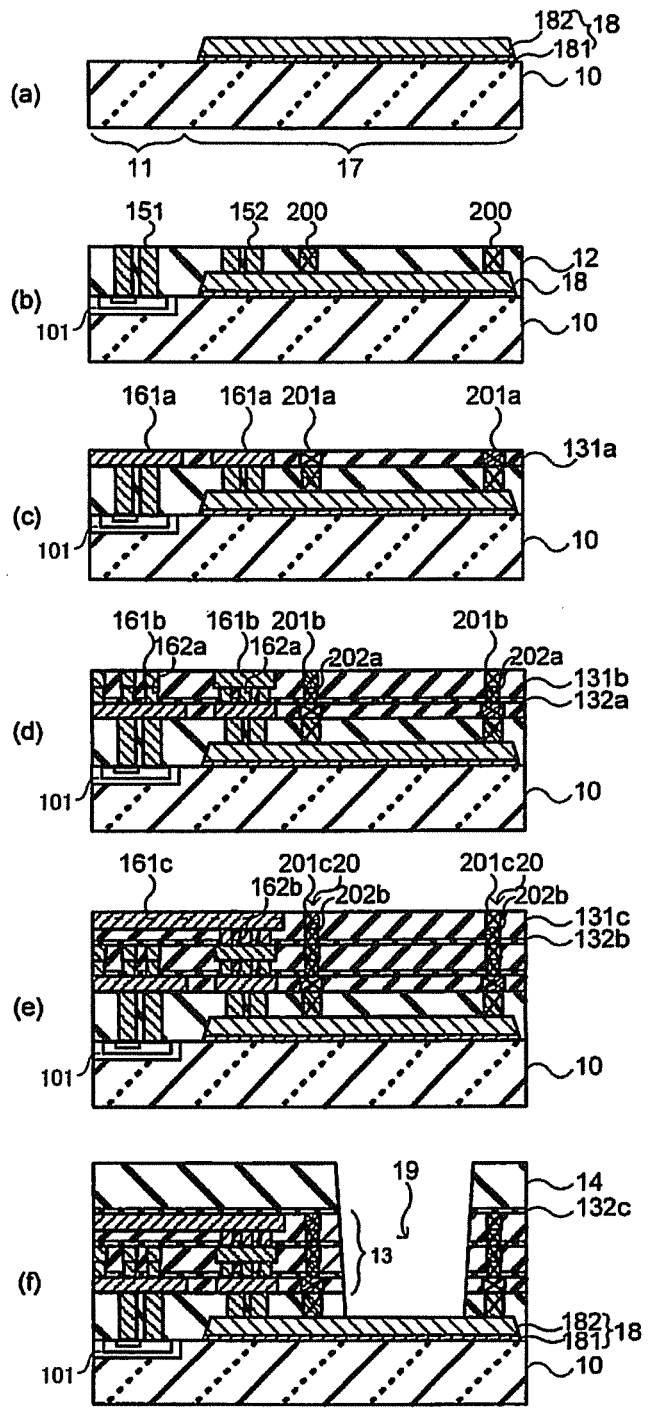
FIG. 3 is a view illustrating semiconductor device manufacturing steps according to an embodiment.

As illustrated in FIG. 3(a), the active element 101 such as a transistor is formed in the element area 11 of the substrate 10, and then the barrier metal layer 181 and Al layer 182 are sequentially formed on the substrate 10. By coating and forming the resist film and then patterning the resist to form a mask in a predetermined area on the non-element area 17 and removing an exposed portion by RIE (Reactive Ion Etching) processing, the metal pad 18 is formed (Step 1-1).

As illustrated in FIG. 3(b), after the insulating layer 12 is formed on the substrate 10 including the upper side of the metal pad 18, a contact hole (not illustrated) reaching the substrate 10 and metal pad 18, and an annular opening part (not illustrated) are formed. Then, by filling the contact hole and the annular opening part with W and the like, the substrate contact 151, the pad contact 152 and the ring metal layer 200 forming the lower surface of the pad ring 20 are formed (Step 1-2).

As illustrated in FIG. 3(c), after the low-k film 131a is formed on their upper surfaces, grooves (not illustrated) of the wiring patterns and ring patterns are formed, and the wiring layer 161a of the lowermost layer and the ring shaped metal layer 201a forming the upper layer of the pad ring 20 are formed in the grooves by, for example, Cu plating (Step 1-3). In addition, the metal layer 201a is in contact with the metal layer 200.

As illustrated in FIG. 3(d), after the cap film 132a and low-k film 131b are sequentially formed on the substrate 10 and grooves of the wiring patterns, via patterns and a ring pattern are formed by a dual damascene method, the via 162a, wiring layer 161b and the ring metal layers 202a and 201b forming the upper layer of the pad ring 20 are formed by Cu plating. The metal layer 202a is in contact with the metal layer 201b and metal layer 201a.

Similarly, as illustrated in FIG. 3(e), the cap film 132b and low-k film 131c are formed and the vias 162b, the wiring layer 161c and the ring metal layers 202b and 201c are formed. The metal layer 202b is also in contact with the metal layer 201c and metal layer 201b. In this way, the multilayer wiring 16 and the pad ring 20 is formed (Step 1-4).

As illustrated in FIG. 3(f), after the cap film 132c and passivation film 14 are formed on the wiring layer 161c, the low-k film 131a and the metal layer 201c, a resist (not shown) is coated and is patterned thereon. The opening window 19 is formed by removing the passivation film 14 and the interlayer insulating film 13 by RIE processing using the patterned resist as a mask, and the Al layer 182 of the surface of the metal pad 18 is exposed (Step 1-5).

The metal pad 18 is bonded by the wire 21 through the opening window 19, so that the semiconductor device illustrated in FIG. 1 is formed.

The semiconductor device according to the present embodiment adopts a structure in which the metal pad 18 is formed closer to the substrate 10 than the wiring layer 161 of the lowermost layer, and a wire is not bonded on the element area 11, so that it is possible to prevent deformation or cracking of the low-k film 131 due to the load upon wire bonding. Consequently, it is possible to prevent oxidation of a barrier metal film due to absorption of moisture in the low-k film 131 and prevent a decrease in the reliability of the semiconductor device.

With the present embodiment, an opening window reaching a metal pad positioned closer to the substrate 10 than the wiring layer of the lowermost layer is provided, and therefore there is a possibility that an interlayer insulating film is exposed in the wall surface of the opening window and moisture infiltrates the wall surface. However, by forming a pad ring to surround the opening window, it is possible to prevent infiltration of moisture from the opening window. Consequently, it is possible to prevent oxidation of a barrier metal film due to absorption of moisture in the low-k film and prevent a decrease in the reliability of the semiconductor device.

Although, when a metal pad is formed, lithography conventionally needs to be performed twice using, for example, an i line, it is possible to reduce the number of times of lithography for forming the metal pad to one time in the present embodiment.

According to the present embodiment, it is possible to make the surface layer of the metal pad as the same conventional Al layer and maintain compatibility with a conventional technique. Meanwhile, the surface layer is not limited to the Al layer, the layer only needs to have conductivity.

Second Embodiment

Although the semiconductor device according to the present embodiment employs the same structure as in the first embodiment in which an opening window is provided in an interlayer insulating film, the structure of a metal pad is different.

Figure 4:
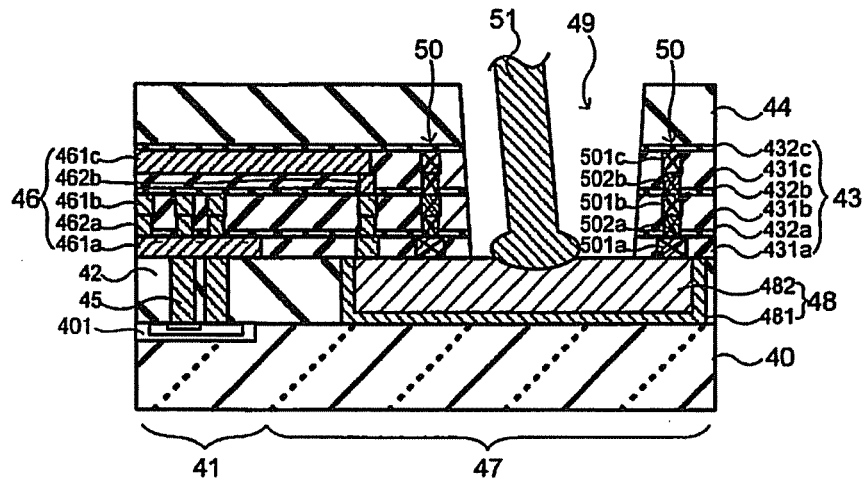
FIG. 4 is a view illustrating a semiconductor device according to an embodiment.

FIG. 4 is a sectional view of a semiconductor device according to the present embodiment. As illustrated in FIG. 4, similar to the first embodiment, an insulating layer 42 is formed on an element area 41 of a substrate 40. Similar to the first embodiment, on the insulating layer 42, an interlayer insulating film 43 is formed. The interlayer insulating film 43 is composed of alternate three layers of low-k films 431a, 431b and 431c, and cap films 432a, 432b and 432c. A passivation film 44 is formed on the interlayer insulating film 43.

Note that, although in the present embodiment, the interlayer insulating film 43 is formed by layering three layers of low-k films and cap films, similar to the first embodiment, the number of layers is not limited to this, and, for example, ten or more layers may be formed as necessary. The same applies to wiring layers or vias which will be described below.

A substrate contact 45 is formed in the insulating layer 42 on the element area 41, and, on the upper surface of the substrate contact 45, a multilayer wiring 46 is formed through the low-k film 431 and cap film 432. The, multilayer wiring 46 is composed of alternate wiring layers 461a, 461b and 461c and vias 462a and 462b of a predetermined pattern.

On a non-element area 47 which is an area other than the element area 41, a metal pad 48 is formed on the lower surface closer to the semiconductor substrate 40 side than the wiring layer 461a of the lowermost layer. The metal pad 48 is composed of a W layer 481 and the like of a lower layer and an Al layer 482 and the like of an upper layer. The metal pad 48 is connected with the multilayer wiring 46 on the element area 41 through the wiring layers 461a, 461b and 461c and vias 462a and 462b. The opening window 49 reaching the metal pad 48 is provided to penetrate the passivation film 44 and interlayer insulating film 43.

A pad ring 50 is provided to penetrate the interlayer insulating film 43 on the metal pad 48 and surround the opening window 49. The pad ring 50 is formed with layered bodies including ring shaped metal layers 501a, 501b, 501c, 502a and 502b made of the same material in the same layers as the wiring layers 461a, 461b and 461c and vias 462a and 462b, respectively. That is, the metal pad is formed closer to the substrate 40 than the wiring layer 461a of the lowermost layer.

In the metal pad 48, a wire 51 is bonded which is connected with, for example, a lead frame (not illustrated) through the opening window 49.

Figure 5:
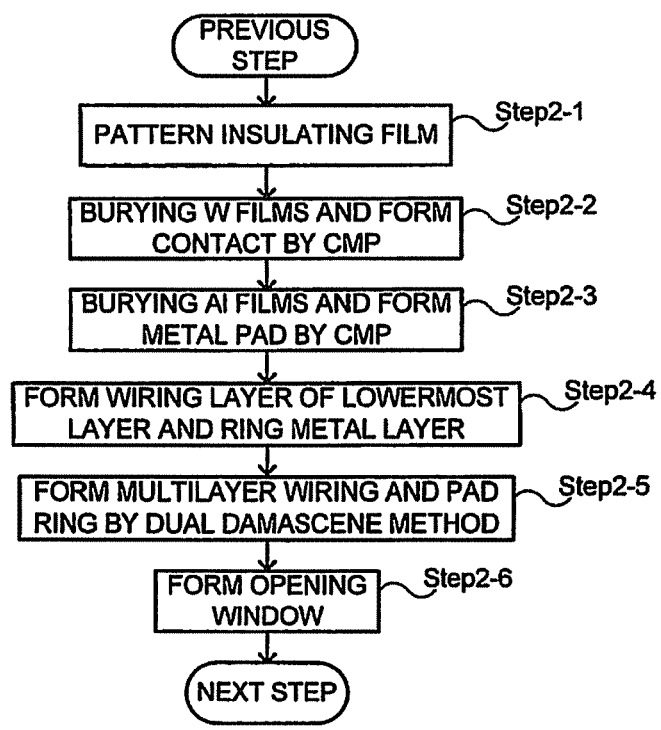
FIG. 5 is a flowchart illustrating semiconductor device manufacturing steps according to an embodiment.

This semiconductor device is formed according to, for example, the manufacturing steps illustrated in the flowchart of FIG. 5.

Figure 6:
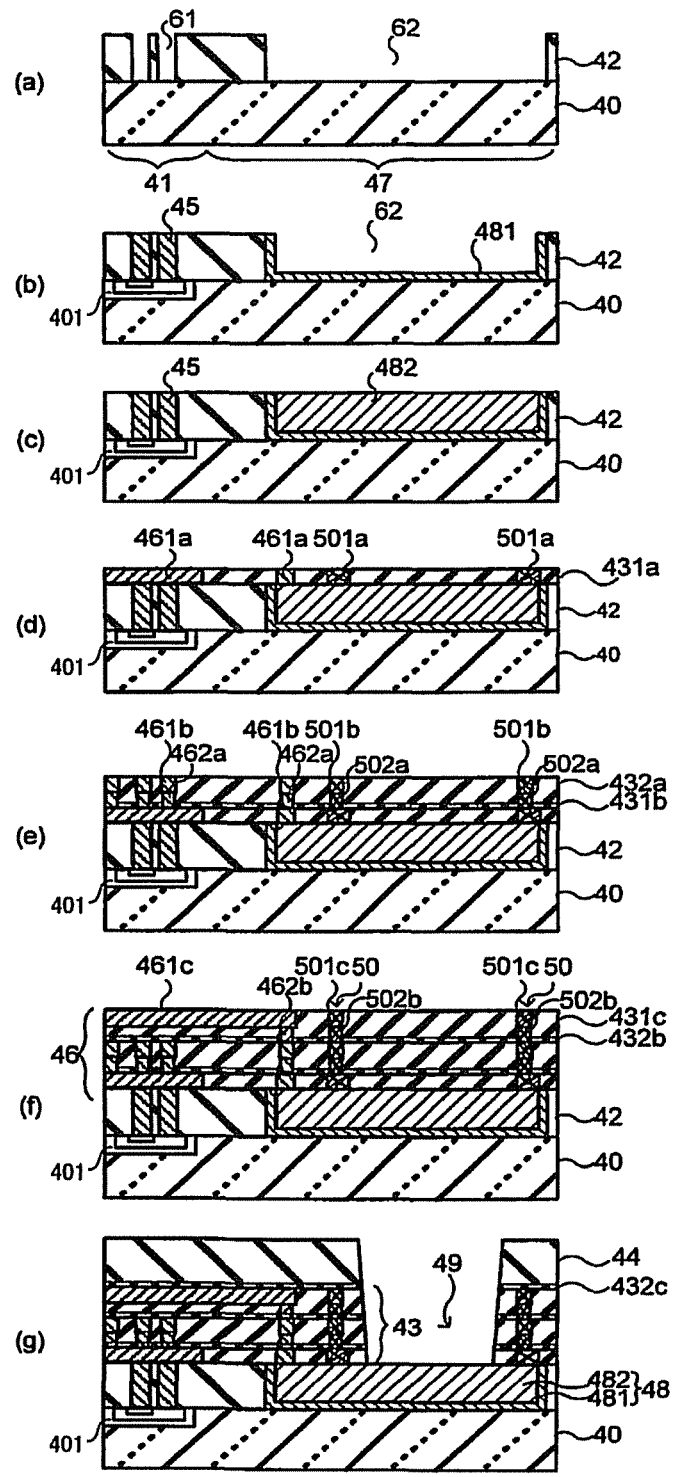
FIG. 6 is a view illustrating semiconductor device manufacturing steps according to an embodiment.

As illustrated in FIG. 6(a), the active element 401 such as a transistor is formed on the element area 41 of the substrate 40, and then the insulating layer 42 is formed on the substrate 40. By coating and patterning the resist and forming a contact hole 61 reaching the substrate 40 on the element area 41 of the substrate 40 by RIE (Reactive Ion Etching) processing, an opening part 62 is formed on a nonelement area 47 (Step 2-1)

As illustrated in FIG. 6(b), the substrate contact 45 is formed by accumulating and planarizing W films by a CMP (Chemical Mechanical Polishing) method to bury the contact hole 61 with W, and the W layer 481 is formed in the opening part 62 (Step 2-2).

As illustrated in FIG. 6(c), an Al layer 482 is formed in the opening part 62 in which the W layer 481 is formed by accumulating and planarizing Al films by the CMP method, and the metal pad 48 having the W layer 481 and Al layer 482 is formed in the opening part 62 (Step 2-3).

In addition, at this time, the metal pad 48 may also be formed by forming and burying the W film in the contact hole 61, continuously forming Al film and collectively planarizing the films by the CMP method.

Similar to the first embodiment, as illustrated in FIG. 6(d), after the low-k film 431a is formed on the upper surface of the metal pad 48, grooves (not illustrated) of the wiring patterns and ring patterns are formed, and the wiring layer 461a of the lowermost layer and the ring shaped metal layer 501a are formed in the grooves by Cu plating (Step 2-4).

As illustrated in FIG. 6(e), after the cap film 431b and the low-k film 432a are sequentially formed and grooves of the wiring patterns, via patterns and ring patterns are formed by a dual damascene method, the via 462a, wiring layer 461b and the ring metal layers 502a and 501b are formed. Similarly, as illustrated in FIG. 6(f), the cap film 432b and the low-k film 431c are sequentially formed and the via 462b, the wiring layer 461c and the ring shaped metal layer 501c are formed. In this way, the multilayer wiring 46 is formed and the pad ring 50 is formed (Step 2-5).

As illustrated in FIG. 6(g), after the cap film 431c and the passivation film 44 are formed, a resist (not illustrated) is coated and is patterned. The opening window 49 is formed by removing the passivation film 44 and the interlayer insulating film 43 of exposed portions by RIE processing, and the Al layer 482 on the surface of the metal pad 48 is exposed (Step 2-6).

The metal pad 48 is bonded by the wire 51 through the opening window 49, so that the semiconductor device illustrated in FIG. 4 is formed.

Similar to the first embodiment, the semiconductor device according to the present embodiment adopts a structure in which a metal pad is formed closer to a semiconductor substrate than a wiring layer of the lowermost layer, and a wire is not bonded on an element area, so that it is possible to prevent deformation or cracking of a low-k film due to the load upon wire bonding. Consequently, it is possible to prevent oxidation of a barrier metal film due to absorption of moisture in the low-k film and prevent a decrease in the reliability of the semiconductor device.

Further, similar to the first embodiment, if a structure is adopted in which an opening window reaching a metal pad closer to the semiconductor substrate than the wiring layer of the lowermost layer is provided, there is a problem in that an interlayer insulating film is exposed in the wall surface of the opening window and moisture infiltrates the wall surface. Hence, as in the present embodiment, by forming a pad ring to surround the opening window, it is possible to prevent infiltration of moisture from the opening window. Consequently, it is possible to prevent oxidation of a barrier metal film due to absorption of moisture in the low-k film and prevent a decrease in the reliability of the semiconductor device.

Further, in the present embodiment, it is possible to bury and form a metal pad in an insulating layer together with formation of a contact and, consequently, form the metal pad without providing an additional lithography step. Although, when a metal pad is formed, lithography conventionally needs to be performed twice using, for example, an i line, it is possible to eliminate this step.

Further, similar to the first embodiment, according to the present embodiment, it is possible to make the surface layer of the metal pad as the same conventional Al layer and maintain compatibility with a conventional technique. Meanwhile, the surface layer is not limited to the Al layer, and the layer only needs to have conductivity.

In these embodiments, although a TEOS film which is generally used can be used as an insulating layer provided on a semiconductor substrate, low-k films can also be used to provide a higher speed and lower power consumption. Further, the low-k films are not limited to the SiOC film and films made of MSQ (Methylsilsesquioxane) formed by CVD (Chemical Vapor Deposition) or coating method, or an organic polymer material such as polyimide can be used.

While certain embodiments have been described, these embodiments have been presented by way of example only, and are not intended to limit the scope of the inventions. Indeed, the novel embodiments described herein may be embodied in a variety of other forms; furthermore, various omission, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a semiconductor substrate having a semiconductor element formed at a surface;
    an insulating layer formed on the surface of the semiconductor substrate;
    a plurality of interlayer insulating films which are formed on the insulating layer and has an opening window;
    a multilayer wiring which is formed with a plurality of wiring layers in the plurality of interlayer insulating films;
    a metal pad connected with the multilayer wiring, an upper surface part of the metal pad being a bottom part of the opening window, the metal pad being formed on the surface of the semiconductor substrate at a position closer than a lowermost layer of the plurality of wiring layers; and
    a pad ring provided on the metal pad, the pad ring penetrating the plurality of interlayer insulating films and the pad ring surrounding the opening window, wherein the metal pad and a substrate contact are formed in the insulating film.

2. The semiconductor device according to claim 1, wherein the semiconductor substrate comprises an element area on which the semiconductor element is formed, and
    the multilayer wiring on the element area is connected with the metal pad through the multilayer wiring on a non-element area which is an area other than the element area.

3. The semiconductor device according to claim 1, wherein an upper surface of the metal pad is in the same plane as an upper surface of the insulating layer.

4. The semiconductor device according to claim 1, wherein an upper surface of the metal pad is closer to the substrate than an upper surface of the insulating layer.

5. The semiconductor device according to claim 1, wherein an upper surface of the metal pad is a layer comprising Al.

6. The semiconductor device according to claim 1, wherein the plurality of interlayer insulating films comprise a low-k film having a relative permittivity equal to or less than 2.5.

7. The semiconductor device according to claim 1, wherein a wire is bonded to the metal pad through the opening window.

* * * * *